(12) United States Patent
Park et al.

(10) Patent No.: US 9,419,243 B2
(45) Date of Patent: Aug. 16, 2016

(54) ORGANIC LIGHT-EMITTING DIODE DISPLAY, AN ELECTRONIC DEVICE INCLUDING THE SAME, AND METHOD OF MANUFACTURING SAID ORGANIC LIGHT-EMITTING DIODE DISPLAY

(71) Applicant: Samsung Display Co., Ltd., Yongin, Gyeonggi-Do (KR)

(72) Inventors: Yong-Hwan Park, Yongin (KR); Jae-Seob Lee, Yongin (KR); Gyoo-Chul Jo, Yongin (KR); Jin-Kyu Kang, Yongin (KR); Jun Heo, Yongin (KR); Sung-Guk An, Yongin (KR); Sung-Sik Bae, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/175,882

(22) Filed: Feb. 7, 2014

(65) Prior Publication Data

US 2014/0339517 A1 Nov. 20, 2014

(30) Foreign Application Priority Data

May 16, 2013 (KR) .......................... 10-2013-0056042

(51) Int. Cl.
*H01L 21/00* (2006.01)
*H01L 51/52* (2006.01)
*H01L 51/00* (2006.01)

(52) U.S. Cl.
CPC ........ *H01L 51/5253* (2013.01); *H01L 51/0097* (2013.01); *H01L 51/524* (2013.01); *Y02E 10/549* (2013.01)

(58) Field of Classification Search
CPC . H01L 51/5237; H01L 51/56; H01L 51/5253; H01L 51/0097; H01L 51/524; H01L 51/52; Y02E 10/549
See application file for complete search history.

(56) References Cited

U.S. PATENT DOCUMENTS

| 6,268,695 | B1 | 7/2001 | Affinito |
| 7,446,473 | B2 | 11/2008 | Tanaka |
| 2002/0140347 | A1 | 10/2002 | Weaver |
| 2007/0218608 | A1* | 9/2007 | Tanaka .......................... 438/166 |
| 2007/0222370 | A1 | 9/2007 | Zhu et al. |
| 2011/0134018 | A1* | 6/2011 | Seo et al. ......................... 345/76 |
| 2011/0193067 | A1 | 8/2011 | Lee et al. |
| 2012/0100647 | A1* | 4/2012 | Kim ...................... H01L 51/003 438/28 |

FOREIGN PATENT DOCUMENTS

| EP | 2091096 A1 | 8/2009 |
| JP | 2005-347083 | 12/2005 |
| KR | 1020080004232 A | 9/2008 |
| KR | 10-2008-0104324 | 12/2008 |

* cited by examiner

*Primary Examiner* — Charles Garber
*Assistant Examiner* — Abdulfattah Mustapha
(74) *Attorney, Agent, or Firm* — Innovation Counsel LLP

(57) ABSTRACT

Provided is an organic light-emitting diode (OLED) display including: a first plastic layer; a first barrier layer formed on the first plastic layer; a first intermediate layer formed on the first barrier layer; a second plastic layer formed on the intermediate layer; an OLED layer formed on the second plastic layer; and a thin-film encapsulation layer encapsulating the OLED layer.

31 Claims, 10 Drawing Sheets

LASER BEAM

LASER BEAM

ORGANIC LIGHT-EMITTING DIODE DISPLAY, AN ELECTRONIC DEVICE INCLUDING THE SAME, AND METHOD OF MANUFACTURING SAID ORGANIC LIGHT-EMITTING DIODE DISPLAY

CROSS-REFERENCE TO RELATED PATENT APPLICATION

This application claims the benefit of Korean Patent Application No. 10-2013-0056042, filed on May 16, 2013 in the Korean Intellectual Property Office, the disclosure of which is incorporated herein by reference in its entirety.

BACKGROUND OF THE INVENTION

1. Field of the Invention

The present disclosure relates generally to organic light-emitting diode (OLED) displays. More specifically, the present disclosure relates to an OLED display including a flexible substrate, an electronic device including the OLED display, and a method of manufacturing said OLED display.

2. Description of the Related Art

An organic light-emitting diode (OLED) display is a self-emission type display that includes a hole injection electrode, an electron injection electrode, and an organic emission layer disposed therebetween. In such a display, light is emitted when holes injected from the hole injection electrode and electrons injected from the electron injection electrode are recombined in the organic emission layer.

The OLED display has been attracting attention as a potential next generation display since the OLED display has desirable characteristics such as low power consumption, excellent luminance, and a high response speed.

If a glass substrate that is heavy and easily breakable is used in the OLED display, portability and large screen display capabilities may be limited. Thus, recently, a flexible OLED display that uses a flexible substrate formed of plastic, which is not only light but also resilient to shocks, has been developed.

However, since moisture or oxygen may relatively easily penetrate through such flexible substrates, deterioration of the organic emission layer, which is vulnerable to moisture or oxygen, may be accelerated.

SUMMARY OF THE INVENTION

The present invention provides an organic light-emitting diode (OLED) display including a flexible substrate that has a low water vapor transmission rate and high adhesive strength, as well as a method of manufacturing such an OLED display.

According to an aspect of the present invention, there is provided an organic light-emitting diode (OLED) display including: a first plastic layer; a first barrier layer formed on the first plastic layer; a first intermediate layer formed on the first barrier layer; a second plastic layer formed on the first intermediate layer; an OLED layer formed on the second plastic layer; and a thin-film encapsulation layer encapsulating the OLED layer.

The first intermediate layer may include an amorphous material.

The first intermediate layer may include amorphous silicon.

The first intermediate layer may include a metal thin film.

The first intermediate layer may have an ultraviolet (UV) light transmittance of at least 10%.

The first intermediate layer may be patterned so that the first intermediate layer and the OLED layer substantially overlap each other.

The OLED display can include a first region and a second region adjacent to the first region, where the first intermediate layer and the OLED layer overlap each other in the first region, and where the first barrier layer and the second plastic layer contact each other in the second region.

The first and second plastic layers may collectively include at least one of polyimide, polyethylene naphthalate, polyethylene terephthalate, polyarylate, polycarbonate, polyethersulfone, and polyether imide.

A thickness of the second plastic layer may be greater than a thickness of the first plastic layer.

A viscosity of the second plastic layer may be lower than a viscosity of the first plastic layer.

The first barrier layer may include an inorganic material.

The inorganic material may include at least one of a metal oxide, a silicon oxide, and a silicon nitride.

The first barrier layer may include at least one layer.

The OLED display may further include a second barrier layer positioned between the second plastic layer and the OLED layer.

The second barrier layer may include an inorganic material and may also include at least one layer.

The OLED display may further include, between the second barrier layer and the OLED layer, at least one group of layers including a third plastic layer and a third barrier layer, wherein a second intermediate layer may be further formed between the second barrier layer and the third plastic layer.

According to another aspect of the present invention, there is provided an electronic device including the OLED display.

According to another aspect of the present invention, there is provided a method of manufacturing an organic light-emitting diode (OLED) display, the method including: preparing a carrier substrate; forming a mother flexible substrate on the carrier substrate, wherein the mother flexible substrate comprises a first plastic layer, a first barrier layer, a first intermediate layer, and a second plastic layer that are sequentially stacked on each other; forming a plurality of OLED layers on the mother flexible substrate; forming a thin-film encapsulation layer encapsulating the plurality of OLED layers; separating the carrier substrate and the mother flexible substrate; and dividing the mother flexible substrate into a plurality of display units each including one of the OLED layers.

The separating of the carrier substrate and the mother flexible substrate may include separating the carrier substrate and the mother flexible substrate by irradiating a laser beam onto a first surface of the carrier substrate opposite to a second surface of the carrier substrate upon which the mother flexible substrate is formed.

The laser beam may be an ultraviolet (UV) light laser beam.

The first intermediate layer may have a UV light transmittance of at least 10%.

The forming of the mother flexible substrate may include forming the first intermediate layer to have a surface area equal to or smaller than that of the first plastic layer.

An end of the second plastic layer and an end of the first barrier layer may contact each other proximate to an end of the carrier substrate.

The forming of the mother flexible substrate may include forming the second plastic layer to have a surface area equal to or smaller than that of the first plastic layer.

An end of the second plastic layer and an end of the first barrier layer may contact each other proximate to an end of the carrier substrate.

The forming of the mother flexible substrate may include forming the first intermediate layer by patterning the first intermediate layer to have a plurality of shapes that are substantially the same as those of the plurality of OLED layers.

The forming of the mother flexible substrate may include forming the second plastic layer to have lower viscosity than the first plastic layer.

The forming of the mother flexible substrate may include forming the second plastic layer to be thicker than the first plastic layer, and/or forming the second plastic layer to have a lower viscosity than that of the first plastic layer.

The forming of the mother flexible substrate may include forming a second barrier layer between the second plastic layer and the OLED layer.

The method may further include: forming at least one group of structures including a third plastic layer and a third barrier layer, the at least one group of structures being positioned between the second barrier layer and an OLED; and forming a second intermediate layer between the second barrier layer and the third plastic layer.

A glass substrate may be used as the carrier substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings for those of ordinary skill in the art to be able to perform the present invention without any difficulty. The invention may, however, be embodied in many different forms and should not be construed as being limited to the embodiments set forth herein.

Also, parts in the drawings unrelated to the detailed description are sometimes omitted to ensure clarity of the present invention. Like reference numerals in the drawings denote like elements, and thus their description will not be repeated.

The same elements denoted by the same reference numerals will be explained in a representative first embodiment and other embodiments will be explained by focusing on elements other than the elements in the first embodiment.

The various drawings are not necessarily to scale. In the drawings, sizes and thicknesses of elements are arbitrarily shown for convenience of explanation, and thus the present invention is not limited thereto.

Thicknesses of various layers and regions in the drawings are expanded for clarity. Thicknesses of some layers and regions are exaggerated for convenience of explanation. It will be understood that when a layer, film, region, or plate is referred to as being "on" another layer, film, region, or plate, it may be directly on the other layer, film, region, or plate or intervening layers, films, regions, or plates elements may be present.

It will be further understood that the terms "includes" and/or "including" used herein specify the presence of stated features, integers, steps, operations, members, components, and/or groups thereof, but do not preclude the presence or addition of one or more other features, integers, steps, operations, members, components, and/or groups thereof. When an element is referred to as being disposed "on" another element, the term "on" may encompass both orientations of "over" and "under", that is, not only "over" in a gravity direction.

As used herein, the term "and/or" includes any and all combinations of one or more of the associated listed items. Expressions such as "at least one of," when preceding a list of elements, modify the entire list of elements and do not modify the individual elements of the list.

Figure 1:
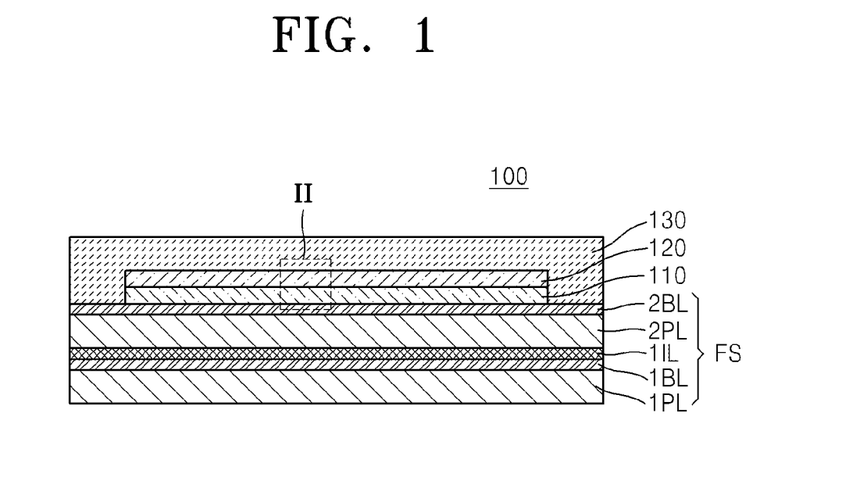
FIG. 1 is a cross-sectional view of an organic light-emitting diode (OLED) display according to an embodiment of the present invention.

FIG. 1 is a cross-sectional view of an organic light-emitting diode (OLED) display 100 according to an embodiment of the present invention.

Referring to FIG. 1, the OLED display 100 includes a flexible substrate FS, a thin-film transistor (TFT) layer 110, an OLED layer 120, and a thin-film encapsulation layer 130.

The flexible substrate FS includes a first plastic layer 1PL, a first barrier layer 1BL, a first intermediate layer 1IL, a second plastic layer 2PL, and a second barrier layer 2BL.

The first and second plastic layers 1PL and 2PL may be formed of a compliant plastic material having excellent thermal resistance and excellent durability, such as polyimide, polyethylene naphthalate, polyethylene terephthalate (PET), polyarylate, polycarbonate, polyether imide (PEI), or polyethersulfone.

Since moisture or oxygen easily penetrates through the first and second plastic layers 1PL and 2PL formed of the plastic material as compared to a glass substrate, an OLED layer 120 employing such plastic layers without any barrier layer is vulnerable to moisture or oxygen and is thus subject to deterioration. The lifespan of such an OLED display 100 may therefore be reduced.

Accordingly, the first barrier layer 1BL is formed on the first plastic layer 1PL and the second barrier layer 2BL is formed on the second plastic layer 2PL.

The first and second barrier layers 1BL and 2BL may be formed of an inorganic material, such as a metal oxide, a silicon nitride, or a silicon oxide. For example, the first and second barrier layers 1BL and 2BL may each be made of a single layer or multilayer of an inorganic material, such as AlO3, SiO2, or SiNx. A water vapor transmission rate (WVTR) of the first and second barrier layers 1BL and 2BL formed of a single layer or multilayer may be lower than or equal to $10^{-5}$ (g/m$^2$/day).

The first intermediate layer 1IL may be formed between the first barrier layer 1BL and the second plastic layer 2PL in order to increase an adhesive strength between the first barrier layer 1BL and the second plastic layer 2PL, as will be described in further detail later.

The TFT layer 110 and the OLED layer 120 are formed on the flexible substrate FS.

Figure 2:
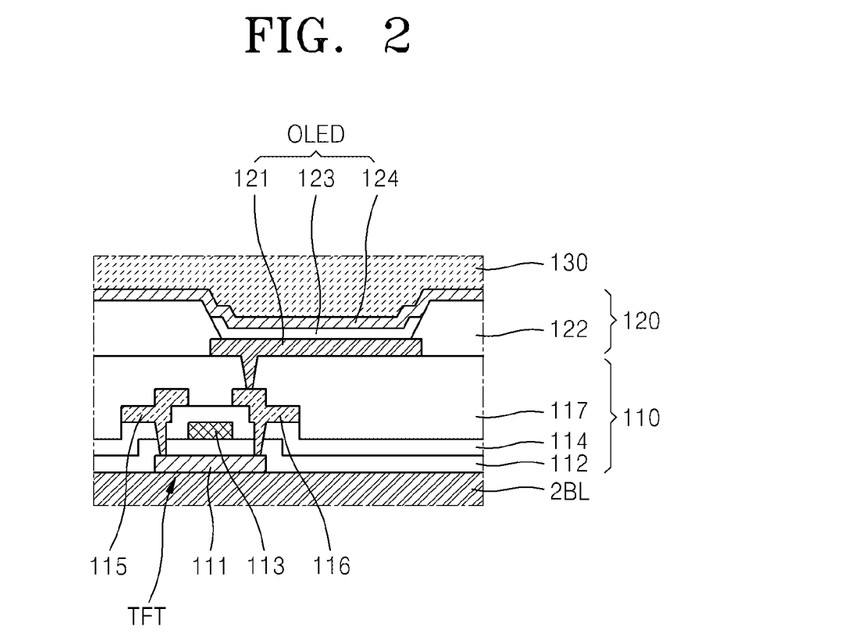
FIG. 2 is an enlarged view of a region II of FIG. 1, illustrating parts of a thin-film transistor (TFT) layer and OLED layer of the OLED display.

FIG. 2 is an enlarged view of a region II of FIG. 1, illustrating parts of the TFT layer 110 and the OLED layer 120 in further detail.

Referring to FIG. 2, a TFT including a semiconductor layer 111, a gate electrode 113, a source electrode 115, and a drain electrode 116 may be formed on the second barrier layer 2BL. A gate insulation film 112 may be formed between the semiconductor layer 111 and the gate electrode 113, and an interlayer insulation film 114 may be formed between the gate electrode 113 and the source electrode 115 and between the gate electrode 113 and the drain electrode 116. Here, the semiconductor layer 111 may be made of amorphous silicon, an organic semiconductive material, or a conductive oxide. In FIG. 2, a top gate type TFT is shown, but the present invention is not limited thereto. In other words, a TFT having any one of various structures, including a bottom gate type TFT, may be used.

Meanwhile, in FIG. 2, the TFT is directly formed on the second barrier layer 2BL, but the present invention is not limited thereto. A buffer layer (not shown) may be further disposed between the second barrier layer 2BL and the TFT. Such a buffer layer flattens the flexible substrate FS and prevents impure elements from penetrating into the semiconductor layer 111 from the flexible substrate FS. In the buffer layer, silicon nitride and/or silicon oxide material may be arranged as a single layer or a plurality of layers (i.e. one or more layers of any one or more of these materials). Also, although not shown in FIG. 2, at least one capacitor may be connected to the TFT.

A passivation layer 117 may be formed on the TFT, and a pixel-defining layer 122 may be formed on the passivation layer 117. The passivation layer 117 may protect the TFT and flatten a top surface of the TFT (i.e., provide an upper surface that is flatter than the TFT).

An OLED may be connected to one of the source and drain electrodes 115 and 116 of the TFT. The OLED may include a pixel electrode 121, a counter electrode 124, and a layer 123 including at least an organic emission layer disposed between the pixel and counter electrodes 121 and 124. The layer 123 may be formed of a low molecular or high molecular organic material. When a low molecular organic material is used, the layer 123 may have a single or complex structure with a hole injection layer (HIL), a hole transport layer (HTL), an emission layer (EML), an electron transport layer (ETL), and an electron injection layer (EIL). When a high molecular organic material is used, the layer 123 may have a structure including an HTL and an EML. The layer 123 may form one unit pixel by using sub-pixels emitting red, green, and blue lights. The layer 123 may be formed as layers including emission materials emitting red, green, and blue lights that are perpendicularly stacked on each other, or with mixed emission materials. Of course, any other combination of colors may be used as long as a white light is emitted. In addition, the OLED display 100 may further include a color changing layer or color filter that changes the white light to a predetermined color.

The counter electrode 124 may be variously modified, for example, may be formed to be continuous across a plurality of pixels.

The pixel electrode 121 may operate as an anode and the counter electrode 124 may operate as a cathode, or vice versa. Also, at least one of the pixel electrode 121 and the counter electrode 124 may be a transparent electrode through which a light emitted from the EML penetrates.

In FIGS. 1 and 2, the OLED layer 120 is formed on the TFT layer 110 for convenience of description. Thus, for example, parts of the TFT layer 110 and OLED layer 120 may be formed on the same layer. For example, the gate electrode 113 of the TFT and the pixel electrode 121 of the OLED may be formed on the same layer.

The thin-film encapsulation layer 130 encapsulating the OLED is formed on the flexible substrate FS. The thin-film encapsulation layer 130 may be formed of one or more inorganic layers or a combination that includes an inorganic layer and an organic layer.

The organic layer may be formed of a polymer and, for example, may be a single layer or multiple stacked layers formed of any one of polyethylene terephthalate, polyimide, polycarbonate, epoxy, polyethylene, and polyacrylate. In detail, the organic layer may be formed of polyacrylate, and in more detail, may include a polymerized monomer composition including a diacrylate-based monomer and a triacrylate-based monomer. A monoacrylate-based monomer may be further included in the polymerized monomer composition. Also, the polymerized monomer composition may further include a well known photoinitiator, such as TPO, but is not limited thereto.

The inorganic layer may be a single layer or multiple stacked layers, one or more of which includes a metal oxide or a metal nitride. In detail, the inorganic layer may include any one of SiNx, Al2O3, SiO2, and TiO2.

An uppermost layer of the thin-film encapsulation layer 130, which is exposed at the exterior of the display 100, may be formed of an inorganic layer in order to prevent water vapor transmission to the OLED.

The thin-film encapsulation layer 130 may include at least one sandwich structure wherein at least one organic layer is inserted between at least two inorganic layers. Alternatively, the thin-film encapsulation layer 130 may include at least one sandwich structure wherein at least one inorganic layer is inserted between at least two organic layers.

The thin-film encapsulation layer 130 may include a first inorganic layer, a first organic layer, and a second inorganic layer sequentially stacked from a top of the OLED. Alternatively, the thin-film encapsulation layer 130 may include a first inorganic layer, a first organic layer, a second inorganic layer, a second organic layer, and a third inorganic layer sequentially stacked from the top of the OLED. Alternatively, the thin-film encapsulation layer 130 may include a first inorganic layer, a first organic layer, a second inorganic layer, a second organic layer, a third inorganic layer, a third organic layer, and a fourth inorganic layer sequentially stacked from the top of the OLED. These and any other combinations of layers are contemplated.

A halogenated metal layer including LiF may be further disposed between the OLED and the first inorganic layer. The halogenated metal layer may prevent the OLED from being damaged while forming the first inorganic layer, and may be formed via a sputtering method or a plasma deposition method.

The first organic layer may have a smaller area than the second inorganic layer, and the second organic layer may have a smaller area than the third inorganic layer. Also, the first organic layer may be completely covered by the second inorganic layer, and the second organic layer may be completely covered by the third inorganic layer.

Meanwhile, in FIGS. 1 and 2, the thin-film encapsulation layer 130 is directly formed on the counter electrode 124, but alternatively, another component, such as a filler or an adhesive material, may be further disposed between the counter electrode 124 and the thin-film encapsulation layer 130.

Figure 3:
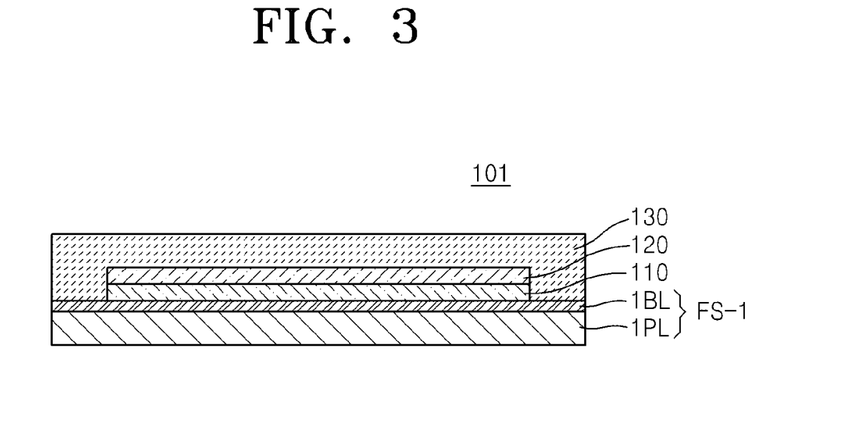
FIG. 3 is a cross-sectional view of an OLED display according to a comparative example.

FIG. 3 is a cross-sectional view of an OLED display 101 according to a comparative example.

Referring to FIG. 3, the OLED display 101 includes a flexible substrate FS-1, the TFT layer 110, the OLED layer 120, and the thin-film encapsulation layer 130.

The flexible substrate FS-1 includes the first plastic layer 1PL and the first barrier layer 1BL. In other words, the flexible substrate FS-1 includes one plastic layer and one barrier layer.

As shown in the comparative example, when the flexible substrate FS-1 is formed only of one plastic layer and one barrier layer, the first barrier layer 1BL may be damaged, for example, cracked, due to impurities or retraction defects formed on the first plastic layer 1PL and/or the first barrier layer 1BL. Moisture or oxygen may penetrate through such a damaged surface, and thus the OLED may be damaged.

Figure 4:
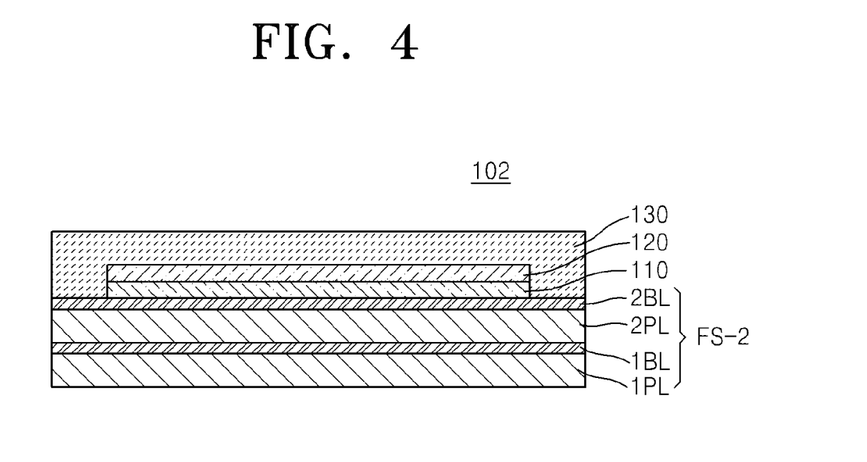
FIG. 4 is a cross-sectional view of an OLED display according to another embodiment of the present invention.

FIG. 4 is a cross-sectional view of an OLED display 102 according to another embodiment of the present invention.

Referring to FIG. 4, the OLED display 102 includes a flexible substrate FS-2, the TFT layer 110, the OLED layer 120, and the thin-film encapsulation layer 130.

The flexible substrate FS-2 includes the first plastic layer 1PL, the first barrier layer 1BL, the second plastic layer 2PL, and the second barrier layer 2BL. In other words, in the flexible substrate FS-2, a structure that includes a plastic layer and a barrier layer formed on the plastic layer is formed twice.

Impurities or retraction defects may be randomly formed not only in the first plastic layer 1PL and the first barrier layer 1BL, but also in the second plastic layer 2PL and the second barrier layer 2BL. However, since an average water vapor transmission path from a defected region to an OLED is longer in the OLED display 102 than the OLED display 101, the OLED may be prevented from being damaged even if the first barrier layer 1BL and/or the second barrier layer 2BL are damaged, for example, cracked.

Here, dark spot defects may be reduced as the flexible substrate FS-2 has a lower water vapor transmission, but since an adhesive strength between the first barrier layer 1BL that is an inorganic film and the second plastic layer 2PL that is an organic film is relatively weak, the first barrier layer 1BL and the second plastic layer 2PL may be detached from each other during manufacture.

Accordingly, in the OLED display 100, the first barrier layer 1BL and the second plastic layer 2PL are not detached from each other since the first intermediate layer 1IL improving the adhesive strength between the first barrier layer 1BL and the second plastic layer 2PL is formed between the first barrier layer 1BL and the second plastic layer 2PL.

The first intermediate layer 1IL may include an amorphous material. The first intermediate layer 1IL may include amorphous silicon as an example of the amorphous material.

Alternatively, the first intermediate layer 1IL may include a metal thin film. The metal thin film may include at least one selected from among indium tin oxide (ITO), aluminum (Al), titanium (Ti), and molybdenum (Mo). However, a material of the first intermediate layer 1IL is not limited to any of these, and any material is contemplated so long as the adhesive strength between the first barrier layer 1BL and the second plastic layer 2PL is improved.

Also, the first intermediate layer 1IL may have a UV light transmittance of at least 10% so that the second plastic layer 2PL is smoothly separated from a glass substrate GS during a process of separating a mother flexible substrate MFS and the glass substrate GS, which is described later with reference to FIGS. 11A and 11B. Accordingly, the first intermediate layer 1IL may have a thickness that is less than or equal to about 100 Å.

Table 1 below shows detachment evaluation results between the first barrier layer 1BL and the second plastic layer 2PL before a structure that does not include the first intermediate layer 1IL on the flexible substrate FS-2 is divided into display units. Sample 1 uses a SiO2 single layer, Sample 2 uses a SiNx single layer, Sample 3 uses a SiO2/SiNx/SiO2 complex layer, and Sample 4 uses a SiNx/SiO2/SiNx complex layer, as the first and second barrier layers 1BL and 2BL.

TABLE 1

| Barrier Layer | Sample 1 (O) | Sample 2 (N) | Sample 3 (ONO) | Sample 4 (NON) |
|---|---|---|---|---|
| Average Adhesive Strength (gh/inch) | 67.73 | 216.41 | 82.83 | 164.38 |

Table 2 below shows detachment evaluation results between the first barrier layer 1BL and the second plastic layer 2PL in a unit of a display, after the structure that does not include the first intermediate layer 1IL on the flexible substrate FS-2 is divided into display units. Sample 5 uses a SiNx/SiO2 complex layer and Sample 6 uses a SiNx/SiO2/SiNx complex layer as the first and second barrier layers 1BL and 2BL.

TABLE 2

| Barrier Layer | Sample 5 (NO) | Sample 6 (NON) |
|---|---|---|
| Average Adhesive Strength (gh/inch) | 34.61 | 39.31 |

Table 3 below shows detachment evaluation results between the first barrier layer 1BL and the second plastic layer 2PL before a structure that includes the first intermediate layer 1IL on the flexible substrate FS is divided into display units. Sample 7 uses ITO, Sample 8 uses Ti, and Sample 9 uses Al, as the first intermediate layer 1IL. Also, Sample 10 uses a-Si as the first intermediate layer 1IL and the a-Si is deposited for a duration of 5 seconds. Sample 11 uses a-Si as the first intermediate layer 1IL and the a-Si is deposited for a duration of 10 seconds. In Samples 7 through 11, the first and second barrier layers 1BL and 2BL are formed by using a SiNx/SiO2 complex layer respectively in thicknesses of 600 Å and 1500 Å.

TABLE 3

| Intermediate Layer | Sample 7 (ITO) | Sample 8 (Ti) | Sample 9 (Al) | Sample 10 (a-Si) | Sample 11 (a-Si) |
|---|---|---|---|---|---|
| Average Adhesive Strength (gh/inch) | Undetachable | Undetachable | Undetachable | 126.27 | 328.24 |

Table 4 below shows detachment evaluation results between the first barrier layer 1BL and the second plastic layer 2PL in a display unit after the structure that includes the first intermediate layer 1IL on the flexible substrate FS is divided into display units. Samples 7 through 11 are the same as those in Table 3.

TABLE 4

| Intermediate Layer | Sample 7 (ITO) | Sample 8 (Ti) | Sample 9 (Al) | Sample 10 (a-Si) | Sample 11 (a-Si) |
|---|---|---|---|---|---|
| Average Adhesive Strength (gh/inch) | Undetachable | Undetachable | Undetachable | Undetachable | Undetachable |

Referring to Table 1, before the structure that does not include the first intermediate layer 1IL is divided into display units, an average adhesive strength between the first barrier layer 1BL and the second plastic layer 2PL is from about 60 to about 200 gf/inch, and referring to Table 2, an average adhesive strength between the first barrier layer 1BL and the second plastic layer 2PL in a display unit after the structure is divided into display units is from about 35 to about 40 gf/inch, i.e., low.

However, referring to Table 3, before the structure that includes the first intermediate layer 1IL is divided into display units, i) an average adhesive strength between the first barrier layer 1BL and the second plastic layer 2PL for an a-Si first intermediate layer 1IL is from about 100 to about 300 gf/inch, and ii) the first barrier layer 1BL and the second plastic layer 2PL are undetachable in the metal thin film. Referring to Table 4, the first barrier layer 1BL and the second plastic layer 2PL are undetachable in a display unit after the structure that includes the first intermediate layer 1IL is divided into display units, and thus an average adhesive strength is not measurable. In other words, when the first intermediate layer 1IL is disposed between the first barrier layer 1BL and the second plastic layer 2PL, an adhesive strength between the first barrier layer 1BL and the second plastic layer 2PL significantly increases.

Accordingly, in the OLED display 100 of the embodiment of the present invention, not only is an average water vapor transmission path increased, but also an adhesive strength between a lower barrier layer and an adjacent upper plastic layer is increased so as to improve detachment defects of a display, by alternately stacking two plastic layers and two barrier layers and disposing an intermediate layer between the adjacent plastic and barrier layers to form the flexible substrate FS.

FIGS. 5A through 10 are views for describing a method of manufacturing the OLED display 100, according to an embodiment of the present invention.

Figure 5A:
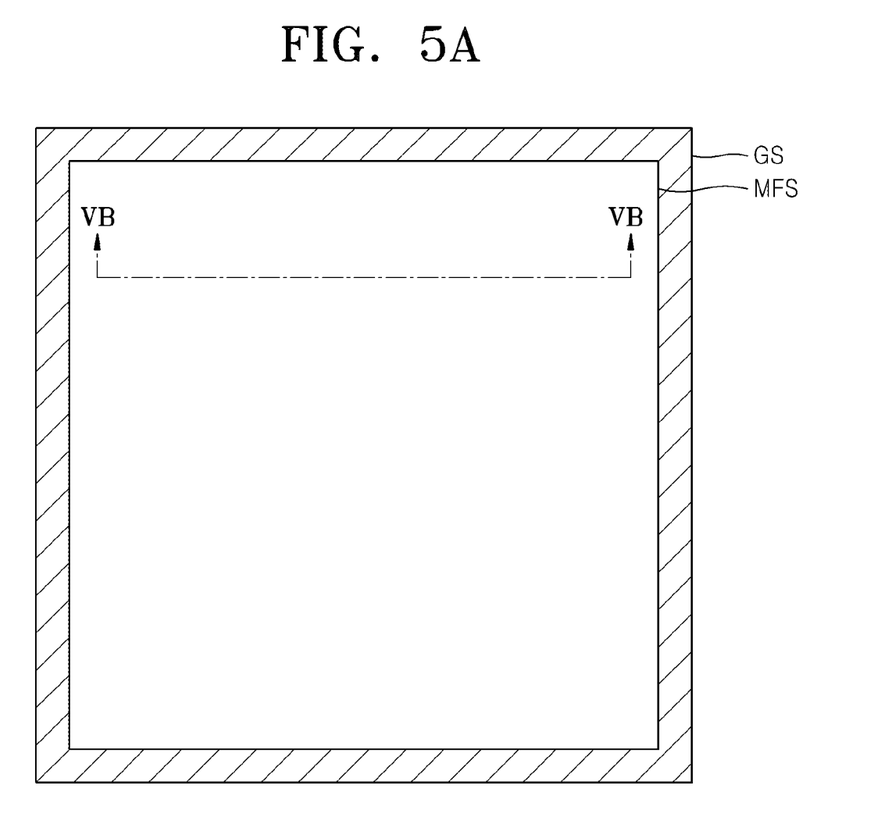
FIG. 5A is a plan view for describing a process of forming a mother flexible substrate on a glass substrate.
Figure 5B:
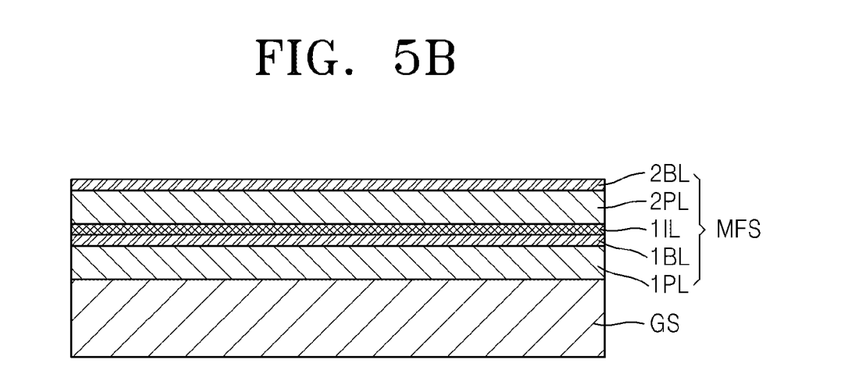
FIG. 5B is a cross-sectional view taken along a line VB-VB of FIG. 5A.

FIG. 5A is a plan view for describing a process of forming the mother flexible substrate MFS on the glass substrate GS, and FIG. 5B is a cross-sectional view taken along a line VB-VB of FIG. 5A.

Referring to FIGS. 5A and 5B, the mother flexible substrate MFS is formed on the glass substrate GS.

The mother flexible substrate MFS is formed of a plastic material and bends or is stretched when heat is applied, and thus it is difficult to precisely form thin film patterns, such as various electrodes or conductive wires, on the mother flexible substrate MFS. Accordingly, several thin film patterns are formed while adhering the mother flexible substrate MFS to the glass substrate GS that is a carrier substrate.

First, a first plastic layer 1PS is formed on the glass substrate GS. The first plastic layer 1PL may be formed by coating and hardening a plastic polymer solution including at least one of polyimide, polyethylene naphthalate, polyethylene terephthalate, polyarylate, polycarbonate, polyether imide, and polyethersulfone on the glass substrate GS, or by laminating a polymer film on the glass substrate GS. Here, examples of a hardening method include a heat hardening method, a UV hardening method, and an electronic beam hardening method.

Then, the first barrier layer 1BL is formed on the first plastic layer 1PS. The first barrier layer 1BL may be formed in a single layer or a multilayer configuration containing an inorganic material, such as AlO3, SiO2, or SiNx, via chemical vapor deposition (CVD), plasma enhanced chemical vapor deposition (PECVD), or atomic layer deposition (ALD).

Then, the first intermediate layer 1IL is formed on the first barrier layer 1BL. The first intermediate layer 1IL may be formed in a single layer or a multilayer configuration containing an amorphous material, such as amorphous silicon, or a metal thin film, such as ITO, Al, Ti, or Mo, via CVD, PECVD, or ALD.

Then, the second plastic layer 2PL is formed on the first intermediate layer 1IL. The second plastic layer 2PL may be formed of the same material as the first plastic layer 1PL via the same method.

Meanwhile, the second plastic layer 2PL may have lower viscosity than the first plastic layer 1PL. When the first and second plastic layers 1PL and 2PL are formed via coating, a high viscosity coating solution includes many impurities, and these impurities may also be coated. Accordingly, the second plastic layer 2PL may have lower viscosity than the first plastic layer 1PL so that filtering can be performed while coating the second plastic layer 2PL. Here, impurities may be reduced by forming the second plastic layer 2PL using a filtered material, and since a coating material forming the second plastic layer 2PL has low viscosity, impurities present in the first plastic layer 1PL and the first barrier layer 1BL may be covered.

Meanwhile, the first plastic layer 1PL and the second plastic layer 2PL have the same thickness in FIGS. 1 and 5A, but an embodiment of the present invention is not limited thereto. Penetration times of oxygen and moisture penetrating from outside the flexible substrate FS are affected more by the thickness of the second plastic layer 2PL, which is closer to the OLED layer 120, than by that of the first plastic layer 1PL. Accordingly, by forming the second plastic layer 2PS closer to the OLED layer 120 to be thicker than the first plastic layer 1PL, penetration times are increased, thereby more effectively preventing deterioration of an OLED.

Then, the second barrier layer 2BL is formed on the second plastic layer 2PL. The second barrier layer 2BL may be formed of the same material as the first barrier layer 1BL via the same method.

Figure 6A:
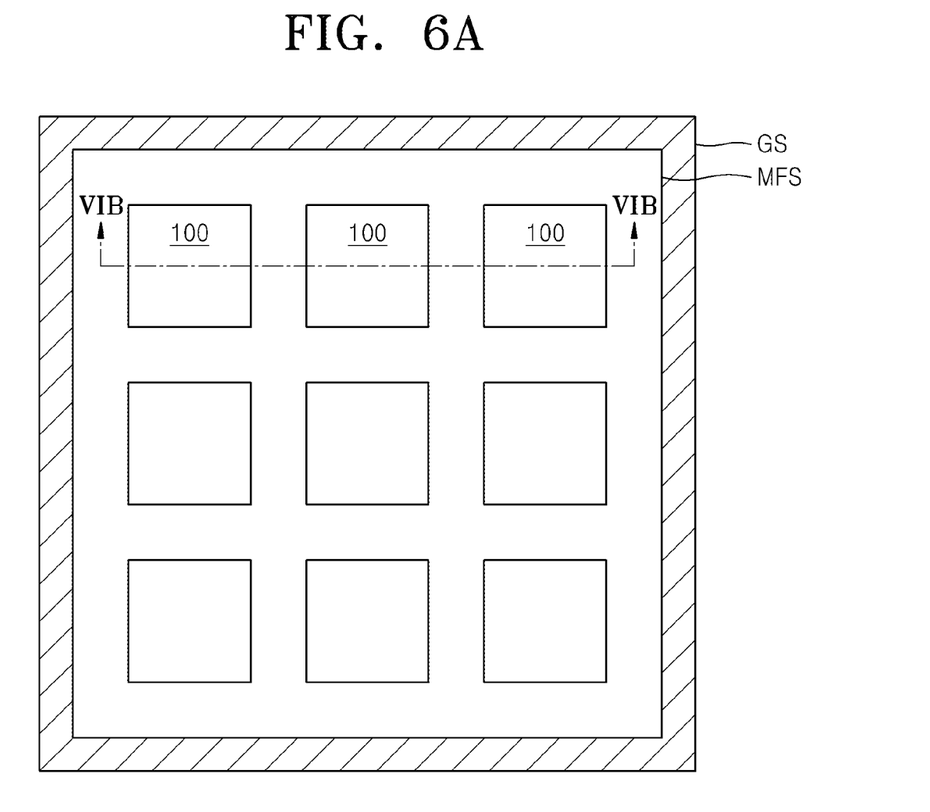
FIG. 6A is a plan view for describing a process of forming a plurality of units of OLED displays on a mother flexible substrate.
Figure 6B:
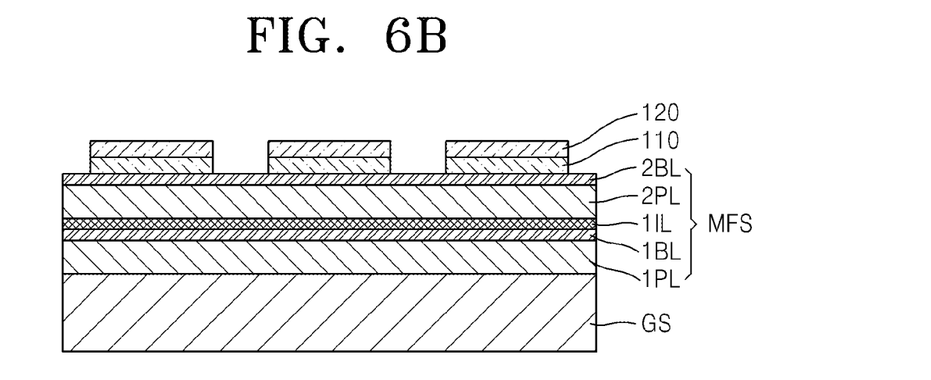
FIG. 6B is a cross-sectional view taken along a line VIB-VIB of FIG. 6A.

FIG. 6A is a plan view for describing a process of forming a plurality of units of OLED displays 100 on the mother flexible substrate MFS, and FIG. 6B is a cross-sectional view taken along a line VIB-VIB of FIG. 6A.

Referring to FIGS. 6A and 6B, the plurality of units of OLED displays 100, each including the TFT layer 110 and the OLED layer 120, are formed on the mother flexible substrate MFS.

Various methods may be applied to form the semiconductor layer 111 (refer to FIG. 2) of the TFT layer 110. For example, when crystalline silicon, amorphous silicon, or conductive oxide is used as the semiconductor layer 111, the semiconductor layer 111 may be formed via a deposition method, such as a PECVD method, an atomic pressure CVD (APCVD) method, or a low pressure CVD (LPCVD) method, and when an organic TFT is applied as the semiconductor layer 111, a coating method or a printing method may be used. Alternatively, when polycrystalline silicon is used as the semiconductor layer 111, amorphous silicon may be crystallized by using any one of various crystallization methods, such as rapid thermal annealing (RTA), solid phase crystallization (SPC), excimer laser annealing (ELA), metal induced crystallization (MIC), metal induced lateral crystallization (MILC), and sequential lateral solidification (SLS).

The gate electrode 113 (refer to FIG. 2), the source electrode 115 (refer to FIG. 2), the drain electrode 116 (refer to FIG. 2), a capacitor (not shown), and various wires (not shown) may be deposited on the TFT layer 110 via CVD, PECVD, or ALD, and the TFT layer 110 may be patterned via a photolithography process.

The layer 123 (refer to FIG. 2) including the organic emission layer of the OLED layer 120 may be formed via any one of various methods, such as a deposition method, a coating method, a printing method, and a light-heat transfer method.

Although not shown in FIG. 6B, a buffer layer may be further disposed between the second barrier layer 2BL and the TFT layer 110.

Figure 7:
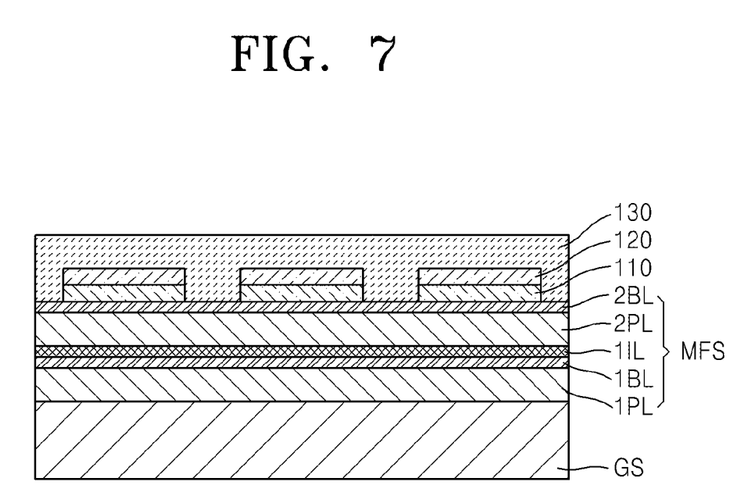
FIG. 7 is a cross-sectional view for describing a process of forming a thin-film encapsulation layer for encapsulating a plurality of OLED layers on a mother flexible substrate.

FIG. 7 is a cross-sectional view for describing a process of forming the thin-film encapsulation layer 130 for encapsulating a plurality of the OLED layers 120 on the mother flexible substrate MFS.

As described above, the thin-film encapsulation layer 130 may be formed as a plurality of inorganic layers or a combination of one or more inorganic layers and one or more organic layers. The inorganic layer and the organic layer may be formed via any one of various methods, such as a CVD method, a PECVD method, and a sputtering method.

Meanwhile, in FIG. 7, the thin-film encapsulation layer 130 commonly covers the entire plurality of units of OLED displays 100, but an embodiment of the present invention is not limited thereto. In other words, the thin-film encapsulation layer 130 may individually cover the units of OLED displays 100.

Figure 8:
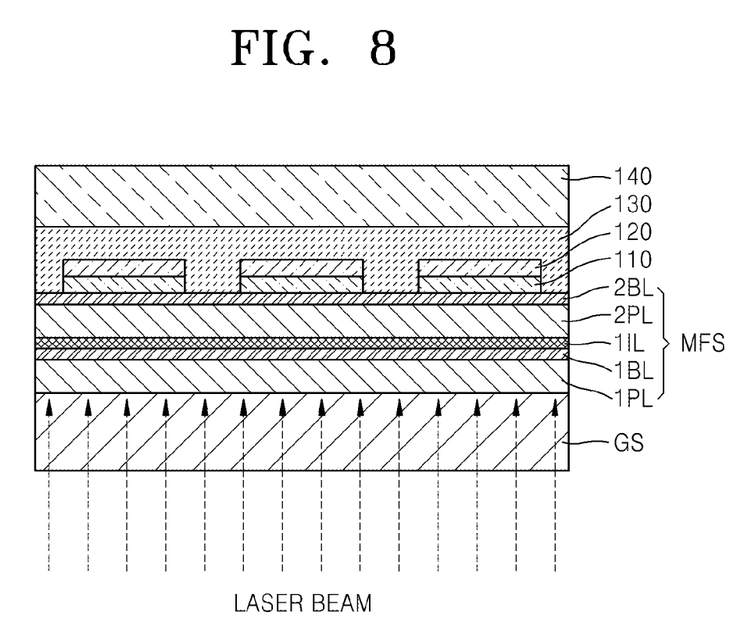
FIGS. 8 and 9 are cross-sectional views for describing a process of separating a glass substrate and a mother flexible substrate.
Figure 9:
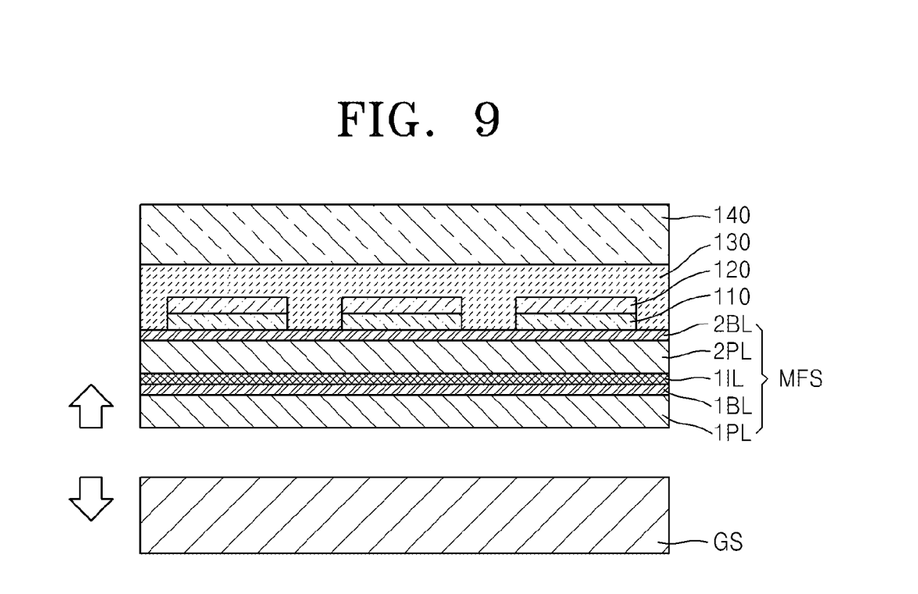

FIGS. 8 and 9 are cross-sectional views for describing a process of separating the glass substrate GS and the mother flexible substrate MFS.

Referring to FIG. 8, in order to separate the mother flexible substrate MFS from the glass substrate GS, a laser beam is irradiated onto a surface of the glass substrate GS opposite to where the mother flexible substrate MFS is formed.

The laser beam may be a UV light irradiated by using an excimer laser. The irradiated UV light penetrates through the glass substrate GS, and is absorbed by the first and second plastic layers 1PL and 2PL. A binding force between the first and second plastic layers 1PL and 2PL and the glass substrate GS is weakened by the absorbed energy. Also, the first and second barrier layers 1BL and 2BL are easily broken by externally-applied tension. Accordingly, by suitably applying the external tension to the mother flexible substrate MFS and the glass substrate GS in directions indicated by arrows of FIG. 9 (i.e. pulling the substrate MFS away from the glass substrate GS in a direction perpendicular to the surface of the glass substrate GS on which the substrate MFS is attached), the mother flexible substrate MFS may be separated from the glass substrate GS.

Meanwhile, a first protection film 140 may be adhered to the thin-film encapsulation layer 130 before the process of separating the mother flexible substrate MFS and the glass substrate GS. The first protection film 140 may be an optical member, such as a polarization film.

Figure 10:
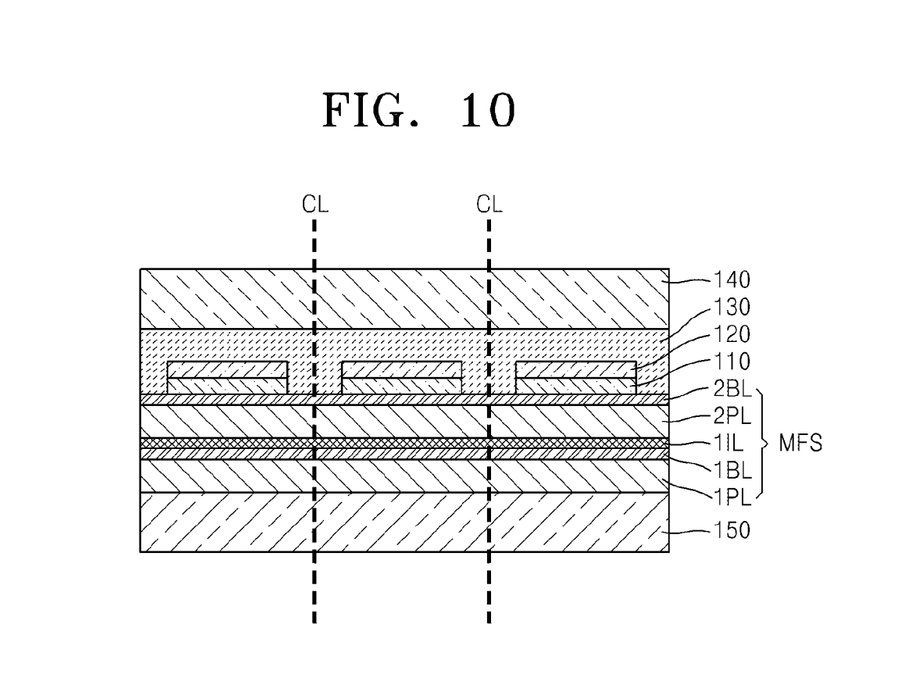
FIG. 10 is a cross-sectional view for describing a process of dividing an OLED layer formed on a mother flexible substrate into a plurality of units of OLED displays.

FIG. 10 is a cross-sectional view for describing a process of dividing the OLED layer 120 formed on the mother flexible substrate MFS into the plurality of units of OLED displays 100.

After separating the mother flexible substrate MFS from the glass substrate GS, a second protection film 150 is adhered to a rear surface of the mother flexible substrate MFS, and then the mother flexible substrate MFS may be divided into the plurality of units of OLED displays 100. The second protection film 150 may be an optical member, such as a polarization film.

The OLED layer 120 formed on the mother flexible substrate MFS may be divided into the plurality of units of OLED displays 100 by cutting the mother flexible substrate MFS along a cutting line CL in a non-display region between the OLED displays 100, using a cutting wheel or a laser cutter.

A method of manufacturing a mother flexible substrate MFS-1 of the OLED display 100 according to another embodiment of the present invention will now be described with reference to FIGS. 11A and 11B.

Figure 11A:
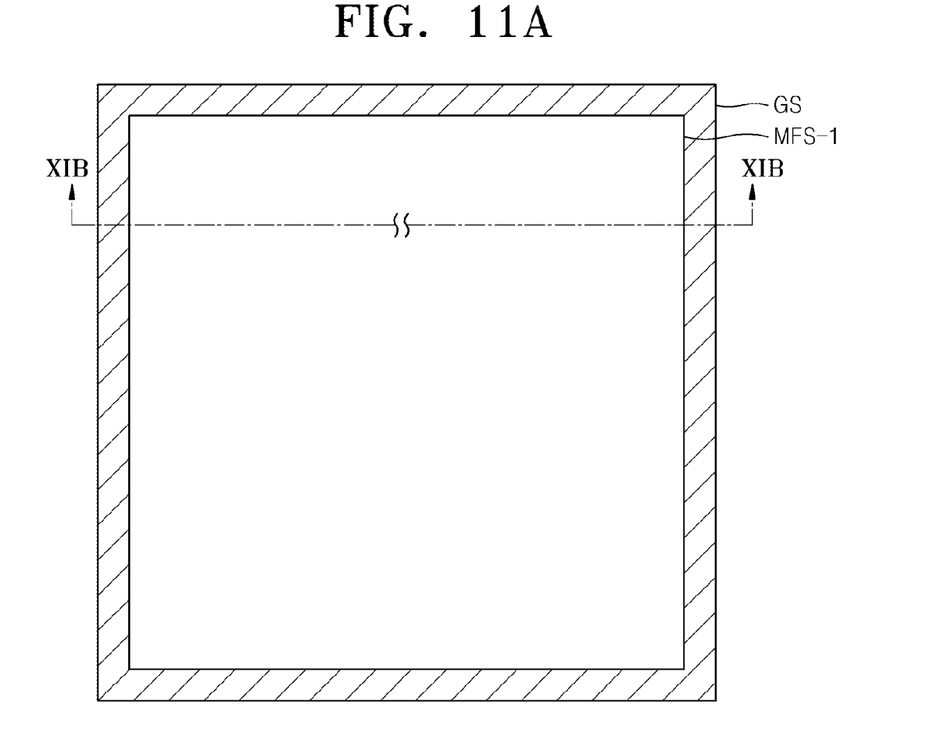
FIG. 11A is a plan view for describing a process of forming a mother flexible substrate on a glass substrate.
Figure 11B:
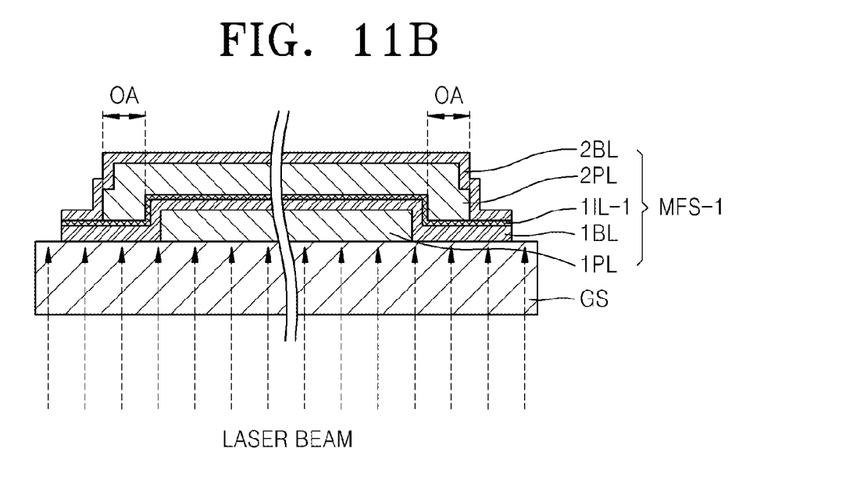
FIG. 11B is a cross-sectional view taken along a line XIB-XIB of FIG. 11A.

FIG. 11A is a plan view for describing a process of forming the mother flexible substrate MFS-1 on the glass substrate GS, and FIG. 11B is a cross-sectional view taken along a line XIB-XIB of FIG. 11A. FIGS. 11A and 11B particularly illustrate in detail an outer region of bonding surfaces of the glass substrate GS and the mother flexible substrate MFS-1.

The first plastic layer 1PL and the second plastic layer 2PL formed on the glass substrate GS are respectively covered by the first barrier layer 1BL and the second barrier layer 2BL.

If an organic coating solution flows outside the glass substrate GS while forming the first and second plastic layers 1PL and 2PL on the glass substrate GS via a coating process, the organic coating solution that flowed outside the glass substrate GS generates a defect. Accordingly, the first and second plastic layers 1PL and 2PL are coated in a region smaller than the glass substrate GS. On the other hand, since the first and second barrier layers 1BL and 2BL are formed via a deposition method, such as CVD or PECVD, the first and second barrier layers 1BL and 2BL are formed closer to an end of the glass substrate GS than the first and second plastic layers 1PL and 2PL.

The second plastic layer 2PL slightly covers, i.e. extends beyond the outer edges of, the first plastic layer 1PL. Even if the second plastic layer 2PL is formed at the same location as the first plastic layer 1PL, the second plastic layer 2PL flows over and beyond an outer region of the first plastic layer 1PL due to fluidity of the coating solution. The first intermediate layer 1IL has the same size (in plan view) as the first and second barrier layers 1BL and 2BL. Accordingly, the outer region of the mother flexible substrate MFS-1 has an overlapping region OA where a first intermediate layer 1IL-1 and the second plastic layer 2PL overlap each other.

While separating the mother flexible substrate MFS-1 and the glass substrate GS, an irradiated UV light has to penetrate through the glass substrate GS and be absorbed by the first and second plastic layers 1PL and 2PL, but in the overlapping region OA, the first intermediate layer 1IL-1 absorbs the UV light, and thus the UV light is prevented from being absorbed in the second plastic layer 2PL. Accordingly, it may be difficult to separate the mother flexible substrate MFS-1 from the glass substrate GS.

Accordingly, the first intermediate layer 1IL-1 may be formed such that the UV light suitably penetrates therethrough. For example, the first intermediate layer 1IL-1 may have UV light transmittance of at least 10%. The first intermediate layer 1IL-1 may have the UV light transmittance of at least 10% by suitably adjusting a thickness of the first intermediate layer 1IL-1 by adjusting a time of forming the first intermediate layer 1IL-1. For example, the thickness of the first intermediate layer 1IL-1 may be less than or equal to about 100 Å.

Figure 12:
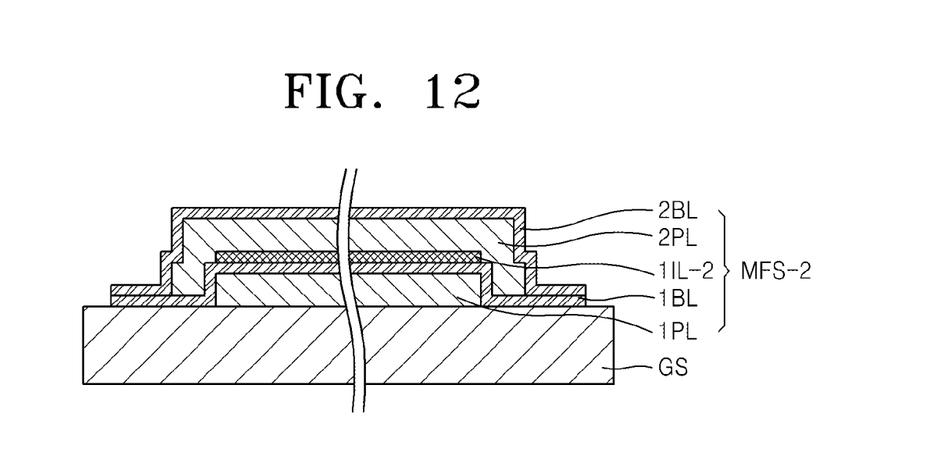
FIG. 12 is a cross-sectional view for describing a method of manufacturing the OLED display of FIG. 1, according to an embodiment of the present invention.

FIG. 12 is a cross-sectional view for describing a method of manufacturing the OLED display 100 of FIG. 1, according to an embodiment of the present invention.

Referring to FIG. 12, a first intermediate layer 1IL-2 is formed to be smaller than or equal in area to the first plastic layer 1PL while forming a mother flexible substrate MFS-2.

In FIGS. 11A and 11B, the UV light transmittance of the first intermediate layer 1IL-1 is adjusted by adjusting the thickness of the first intermediate layer 1IL-1 in the overlapping region OA of the outer region of the mother flexible substrate MFS-1, whereas in FIG. 12, the first intermediate layer 1IL-2 is formed to be smaller than or equal in area to the first plastic layer 1PL so that no overlapping region OA is formed. In other words, an end of the second plastic layer 2PL and an end of the first barrier layer 1BL directly contact each other at an end of the glass substrate GS. Accordingly, the mother flexible substrate MFS-2 may be smoothly separated from the glass substrate GS.

Figure 13:
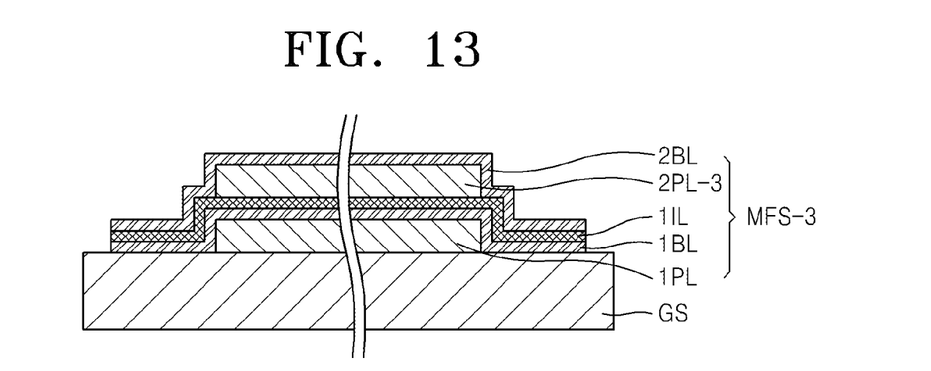
FIG. 13 is a cross-sectional view for describing a method of manufacturing the OLED display of FIG. 1, according to another embodiment of the present invention.

FIG. 13 is a cross-sectional view for describing a method of manufacturing the OLED display 100 of FIG. 1, according to another embodiment of the present invention.

Referring to FIG. 13, a second plastic layer 2PL-3 is formed to be smaller than or equal in area to the first plastic layer 1PL while forming a mother flexible substrate MFS-3.

By forming the second plastic layer 2PL-3 to be smaller than or equal to the first plastic layer 1PL, the second plastic layer 2PL-3 does not have any overlapping region OA as described above with reference to FIG. 12. Accordingly, the mother flexible substrate MFS-3 and the glass substrate GS may be more easily separated from each other. Here, since the second plastic layer 2PL-3 flows on the first plastic layer 1PL during a coating process, an area of the second plastic layer 2PL-3 may be designed smaller than the actual area that is formed during a designing process.

Figure 14:
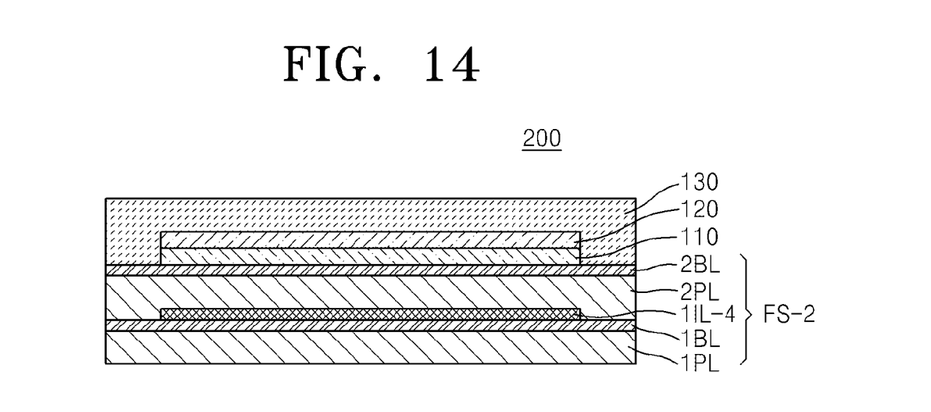
FIG. 14 is a cross-sectional view of an OLED display according to another embodiment of the present invention.

FIG. 14 is a cross-sectional view of an OLED display 200 according to another embodiment of the present invention.

Referring to FIG. 14, the OLED display 200 includes the flexible substrate FS-2, the TFT layer 110, the OLED layer 120, and the thin-film encapsulation layer 130. The current embodiment will be described mainly based on differences between the OLED display 200 and the OLED display 100, and like reference numerals shall be understood based on the above descriptions thereof.

The flexible substrate FS-2 of the OLED display 200 includes the first plastic layer 1PL, the first barrier layer 1BL, a first intermediate layer 1IL-4, the second plastic layer 2PL and the second barrier layer 2BL.

The first intermediate layer 1IL-4 of the current embodiment is patterned to be located in a region where the OLED layer 120 is formed. That is, the first intermediate layer 1IL-4 overlaps the TFT layer 110 and OLED layer 120. Here, layer 1IL-4 is of approximately the same size, i.e. surface area, as layers 110 and 120, although embodiments of the invention contemplate layers 1IL-4 that are of differently sized area than layers 110 and 120.

Figure 15A:
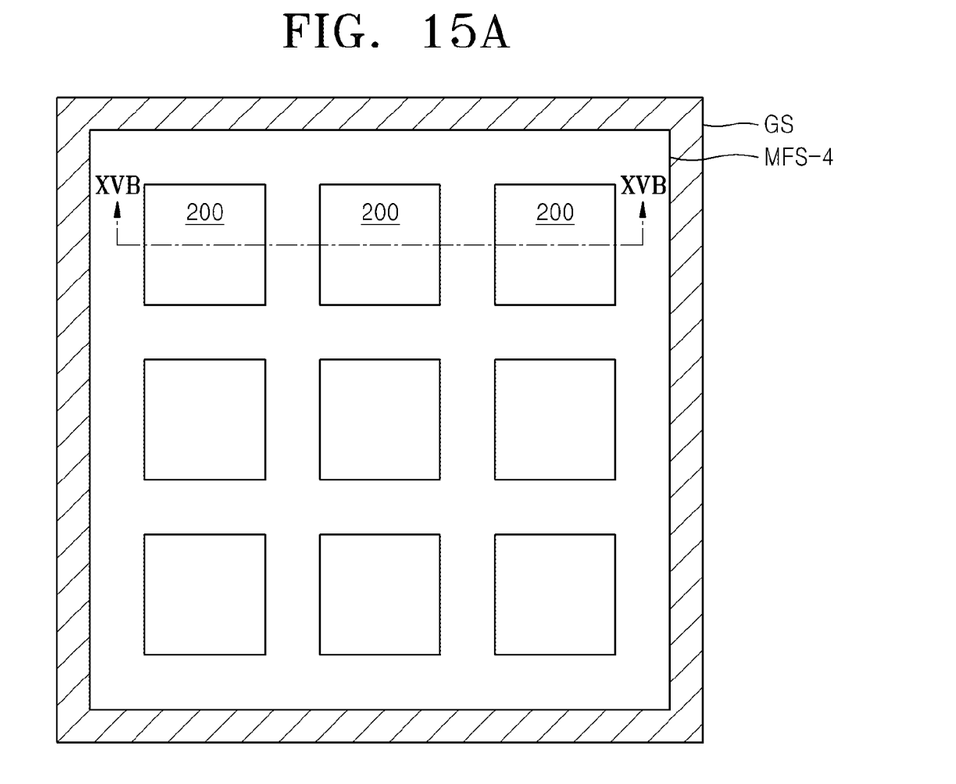
FIGS. 15A and 15B are respectively a plan view and a cross-sectional view for describing a method of manufacturing the OLED display of FIG. 14, according to an embodiment of the present invention.
Figure 15B:
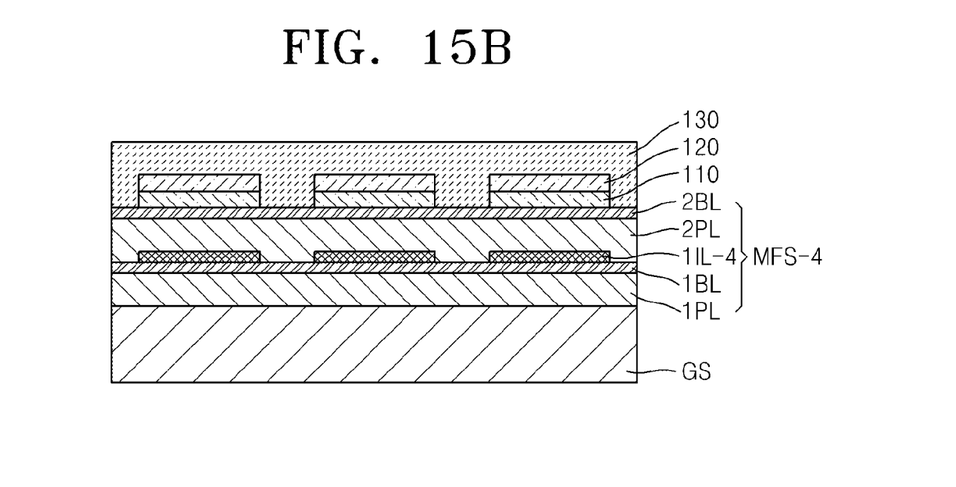

FIGS. 15A and 15B are respectively a plan view and a cross-sectional view for describing a method of manufacturing the OLED display 200 of FIG. 14, according to an embodiment of the present invention.

FIG. 15A is a plan view for describing a process of forming a mother flexible substrate MFS-4 on the glass substrate GS, and FIG. 15B is a cross-sectional view taken along line XVB-XVB of FIG. 15A.

Referring to FIGS. 15A and 15B, the first plastic layer 1PL and the first barrier layer 1BL are sequentially formed on the glass substrate GS, and then the first intermediate layer 1IL-4 is formed.

Here, the first intermediate layer 1IL-4 is formed only in regions corresponding to units of OLED displays 200, and is not formed in a non-display region between the OLED displays 200. That is, the intermediate layers 1IL-4 are only formed under the OLED displays 200, i.e. the intermediate layers 1IL-4 are of substantially the same size and shape (and thus have the same surface area) as the OLED displays 200, and are positioned so that each layer 1IL-4 substantially completely overlaps with its corresponding OLED display 200. Accordingly, in dividing the mother flexible substrate MFS-4 into the plurality of units of OLED displays 200, an inorganic layer, such as the first intermediate layer 1IL-4, is formed without reaching a cutting line so that a crack or contamination generated in the inorganic layer by cutting is reduced.

Also, since the first intermediate layer 1IL-4 is not formed at (i.e. does not extend to) the end of the glass substrate GS, the first intermediate layer 1IL-4 and the second plastic layer 2PL do not overlap at the end of the glass substrate GS. In other words, the end of the second plastic layer 2PL and the end of the first barrier layer 1BL directly contact each other at or near the end of the glass substrate GS. Accordingly, the mother flexible substrate MFS-4 and the glass substrate GS may be more easily separated from each other.

Figure 16:
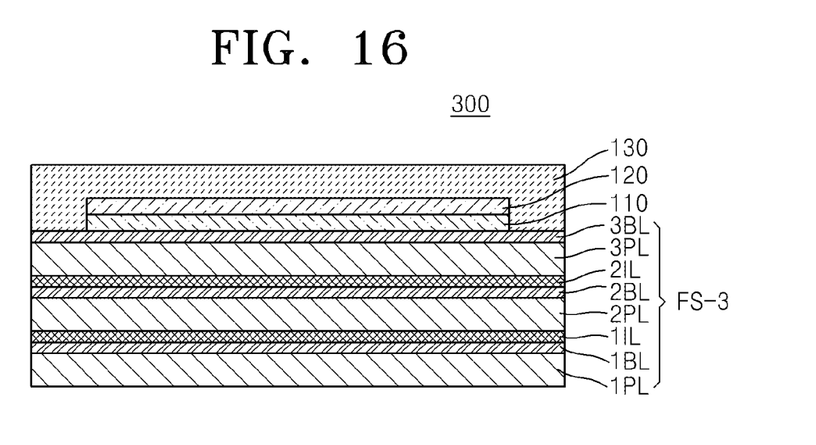
FIG. 16 is a cross-sectional view of an OLED display according to another embodiment of the present invention.

FIG. 16 is a cross-sectional view of an OLED display 300 according to another embodiment of the present invention.

Referring to FIG. 16, the OLED display 300 includes a flexible substrate FS-3, the TFT layer 110, the OLED layer 120, and the thin-film encapsulation layer 130. The current embodiment will be described mainly based on differences between the OLED display 300 and the OLED display 100, and like reference numerals shall be understood based on the above descriptions thereof.

The flexible substrate FS-3 of the OLED display 300 includes the first plastic layer 1PL, the first barrier layer 1BL, the first intermediate layer 1IL, the second plastic layer 2PL, the second barrier layer 2BL, a second intermediate layer 2IL, a third plastic layer 3PL, and a third barrier layer 3BL.

In other words, the flexible substrate FS-3 of the OLED display 300 is formed by alternately stacking three plastic layers and three barrier layers, and disposing intermediate layers between adjacent plastic and barrier layers. Since an average water vapor transmission path is longer in the OLED display 300 than in the OLED display 100, penetration of oxygen and moisture may be further prevented.

Meanwhile, in FIG. 16, three plastic layers and three barrier layers are alternately stacked on each other, but a higher number of plastic and barrier layers may be stacked if required. Here, an intermediate layer is further disposed between adjacent plastic and barrier layers if required.

Although not shown in FIG. 16, the first and second intermediate layers 1IL and 2IL may be patterned as described above with reference to FIG. 14.

Also, the above embodiments are described based on a structure of an OLED display, but the embodiments of the present invention may also be applied to various flexible displays. For example, the embodiments of the present invention may be applied to various electronic devices, such as mobile devices, navigations, video cameras, lap tops, tablet PCs, flat TVs, and beam projectors.

According to one or more embodiments of the present invention described above, a flexible substrate is formed by alternately stacking two plastic layers and two barrier layers and then disposing an intermediate layer between adjacent plastic and barrier layers, thereby increasing an average water vapour transmission path so as to prevent deterioration of an OLED.

Moreover, an adhesive strength between a lower barrier layer and an adjacent upper plastic layer is increased, and thus a detachment defect of an OLED display may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting diode (OLED) display comprising:
    a first plastic layer;
    a first barrier layer formed on the first plastic layer;
    a first intermediate layer formed on and contacting the first barrier layer;
    a second plastic layer formed on and contacting the first intermediate layer;
    a thin film transistor (TFT) layer and an OLED layer formed on the second plastic layer, the TFT layer having a semiconductor layer separated from the first intermediate layer by at least the second plastic layer; and
    a thin-film encapsulation layer encapsulating the OLED layer.

2. The OLED display of claim 1, wherein the first intermediate layer comprises an amorphous material.

3. The OLED display of claim 2, wherein the first intermediate layer comprises amorphous silicon.

4. The OLED display of claim 1, wherein the first intermediate layer comprises a metal thin film.

5. The OLED display of claim 1, wherein the first intermediate layer has an ultraviolet (UV) light transmittance of at least 10%.

6. The OLED display of claim 1, wherein the first intermediate layer is patterned so that the first intermediate layer and the OLED layer substantially overlap each other.

7. The OLED display of claim 6, further comprising a first region and a second region adjacent to the first region, wherein the first intermediate layer and the OLED layer overlap each other in the first region, and wherein the first barrier layer and the second plastic layer contact each other in the second region.

8. The OLED display of claim 1, wherein the first and second plastic layers collectively comprise at least one of polyimide, polyethylene naphthalate, polyethylene terephthalate, polyarylate, polycarbonate, polyethersulfone, and polyether imide.

9. The OLED display of claim 1, wherein a thickness of the second plastic layer is greater than a thickness of the first plastic layer.

10. The OLED display of claim 1, wherein a viscosity of the second plastic layer is lower than a viscosity of the first plastic layer.

11. The OLED display of claim 1, wherein the first barrier layer comprises an inorganic material.

12. The OLED display of claim 11, wherein the inorganic material comprises at least one of a metal oxide, a silicon oxide, and a silicon nitride.

13. The OLED display of claim 11, wherein the first barrier layer comprises at least one layer.

14. The OLED display of claim 1, further comprising a second barrier layer positioned between the second plastic layer and the OLED layer.

15. The OLED display of claim 14, wherein the second barrier layer comprises an inorganic material and further comprises at least one layer.

16. The OLED display of claim 14, further comprising, between the second barrier layer and the OLED layer, at least one group of layers comprising a third plastic layer and a third barrier layer, wherein a second intermediate layer is further formed between the second barrier layer and the third plastic layer.

17. An electronic device comprising the OLED display of claim 1.

18. A method of manufacturing an organic light-emitting diode (OLED) display, the method comprising:
    preparing a carrier substrate;
    forming a mother flexible substrate on the carrier substrate, the mother flexible substrate comprising a first plastic layer, a first barrier layer, a first intermediate layer, and a second plastic layer that are sequentially stacked on each other so that the first intermediate layer contacts both the first barrier layer and the second plastic layer;
    forming a plurality of thin film transistor (TFT) layers and OLED layers on the second plastic layer of the mother flexible substrate, each TFT layer having a semiconductor layer separated from the first intermediate layer by at least the second plastic layer;
    forming a thin-film encapsulation layer encapsulating the plurality of OLED layers;
    separating the carrier substrate and the mother flexible substrate; and
    dividing the mother flexible substrate into a plurality of display units each including one of the OLED layers.

19. The method of claim 18, wherein the separating the carrier substrate and the mother flexible substrate comprises separating the carrier substrate and the mother flexible substrate by irradiating a laser beam onto a first surface of the carrier substrate opposite to a second surface of the carrier substrate upon which the mother flexible substrate is formed.

20. The method of claim 18, wherein the laser beam is an ultraviolet (UV) light laser beam.

21. The method of claim 20, wherein the first intermediate layer has a UV light transmittance of at least 10%.

22. The method of claim 18, wherein the forming a mother flexible substrate comprises forming the first intermediate layer to have a surface area equal to or smaller than that of the first plastic layer.

23. The method of claim 22, wherein an end of the second plastic layer and an end of the first barrier layer contact each other proximate to an end of the carrier substrate.

24. The method of claim 18, wherein the forming a mother flexible substrate comprises forming the second plastic layer to have a surface area equal to or smaller than that of the first plastic layer.

25. The method of claim 24, wherein an end of the second plastic layer and an end of the first barrier layer contact each other proximate to an end of the carrier substrate.

26. The method of claim 18, wherein the forming a mother flexible substrate comprises forming the first intermediate layer by patterning the first intermediate layer to have a plurality of shapes that are substantially the same as those of the plurality of OLED layers.

27. The method of claim 18, wherein the forming a mother flexible substrate comprises forming the second plastic layer to have a lower viscosity than that of the first plastic layer.

28. The method of claim 18, wherein the forming a mother flexible substrate comprises forming the second plastic layer to be thicker than the first plastic layer.

29. The method of claim 18, wherein the forming a mother flexible substrate comprises forming a second barrier layer between the second plastic layer and the OLED layer.

30. The method of claim 29, further comprising:
    forming at least one group of structures comprising a third plastic layer and a third barrier layer, the at least one group of structures being positioned between the second barrier layer and an OLED; and
    forming a second intermediate layer between the second barrier layer and the third plastic layer.

31. The method of claim 18, wherein the carrier substrate is a glass substrate.

* * * * *